United States Patent

Stefenel

[15] 3,701,036

[45] Oct. 24, 1972

[54] VARIABLE GAIN AMPLIFIER SYSTEM

[72] Inventor: Rudy S. Stefenel, San Jose, Calif.

[73] Assignee: Wiltron Company, Palo Alto, Calif.

[22] Filed: Sept. 28, 1970

[21] Appl. No.: 76,187

[52] U.S. Cl. ........................330/85, 330/86, 330/93, 330/104, 330/110, 331/4

[51] Int. Cl. ................................................H03f 1/36

[58] Field of Search........330/28, 29, 85, 86, 93, 104, 330/110; 331/36 C, 4, 177 V

[56] References Cited

UNITED STATES PATENTS

| | | | |
|---|---|---|---|
| 3,489,311 | 12/1969 | Luhowy | 331/4 X |
| 3,525,948 | 8/1970 | Shorer et al. | 330/86 X |

*Primary Examiner*—Roy Lake
*Assistant Examiner*—James B. Mullins
*Attorney*—Flehr, Hohbach, Test, Albritton & Herbert

[57] ABSTRACT

A variable gain amplifier system for providing a tuning voltage to a radio frequency oscillator to linearize its voltage to output frequency characteristic includes an operational amplifier where the feedback loop which controls the gain of the amplifier is coupled to both positive and negative feedback networks. The positive feedback network consists of several diode-resistor legs which inject current into the feedback loop at different input control voltage levels to thus vary the gain of the amplifier. Similarly a negative feedback network consists of several diode-resistor legs which drain current from the amplifier feedback loop at various levels of the input control voltage to increase gain.

7 Claims, 4 Drawing Figures

THE REFERENCE CHARACTERS A-L AND A-I DENOTE A PLURALITY OF ELEMENTS

INVENTOR.
RUDY S. STEFENEL
BY Flehr, Hohbach, Test, Albritton & Herbert
ATTORNEYS INVENTOR
RUDY S. STEFENEL
BY
Flehr, Hohbach, Test, Albritton & Herbert
ATTORNEYS

VARIABLE GAIN AMPLIFIER SYSTEM

BACKGROUND OF THE INVENTION

The present invention is directed to a variable gain amplifier system and more particularly to a system for linearizing the output frequency of a swept oscillator.

A linear ramp control voltage is used as the sweep voltage for a swept oscillator. Since all oscillators are nonlinear to some degree, the linear sweep voltage is shaped to compensate for such nonlinearity. One technique of shaping is the use of an amplifier whose gain is varied by shunting the feedback circuit of the amplifier with resistor-diode legs which conduct at various values of the control voltage. However, this technique merely increases the amplifier's gain and thus can only roughly compensate for nonlinearities. In other words, a selective reduction in gain of the amplifier was unobtainable.

OBJECTS AND SUMMARY OF THE INVENTION

It is, therefore, an object of the present invention to provide a variable gain amplifier system where the gain may be selectively increased or decreased over the entire operating range of the system.

In accordance with the above object there is provided a variable gain amplifier system responsive to an input control voltage signal increasing with time to produce an output voltage which is a shaped function of the input voltage. Amplifier means are provided having feedback means for varying the gain of the amplifier means, an increase or decrease in the amount of feedback signal increasing or decreasing the gain of the amplifier means. First circuit network means are coupled to the feedback means and are responsive to increasing magnitudes of the input control voltage signal for increasing the gain of the amplifier means in a plurality of discrete gain values. Each of such values correspond to a predetermined voltage level of the input control voltage signal. Second circuit network means are coupled to the feedback means and are responsive to increasing magnitudes of the input control voltage signal for decreasing the gain of the amplifier means in a plurality of discrete gain values. Each of such values correspond to a predetermined voltage level of the input control voltage signal, whereby the output signal is a function of the input signal which has been shaped in accordance with the discrete gain values.

DETAILED DESCRIPTION OF THE PREFERRED EMBODIMENT

Figure 1:
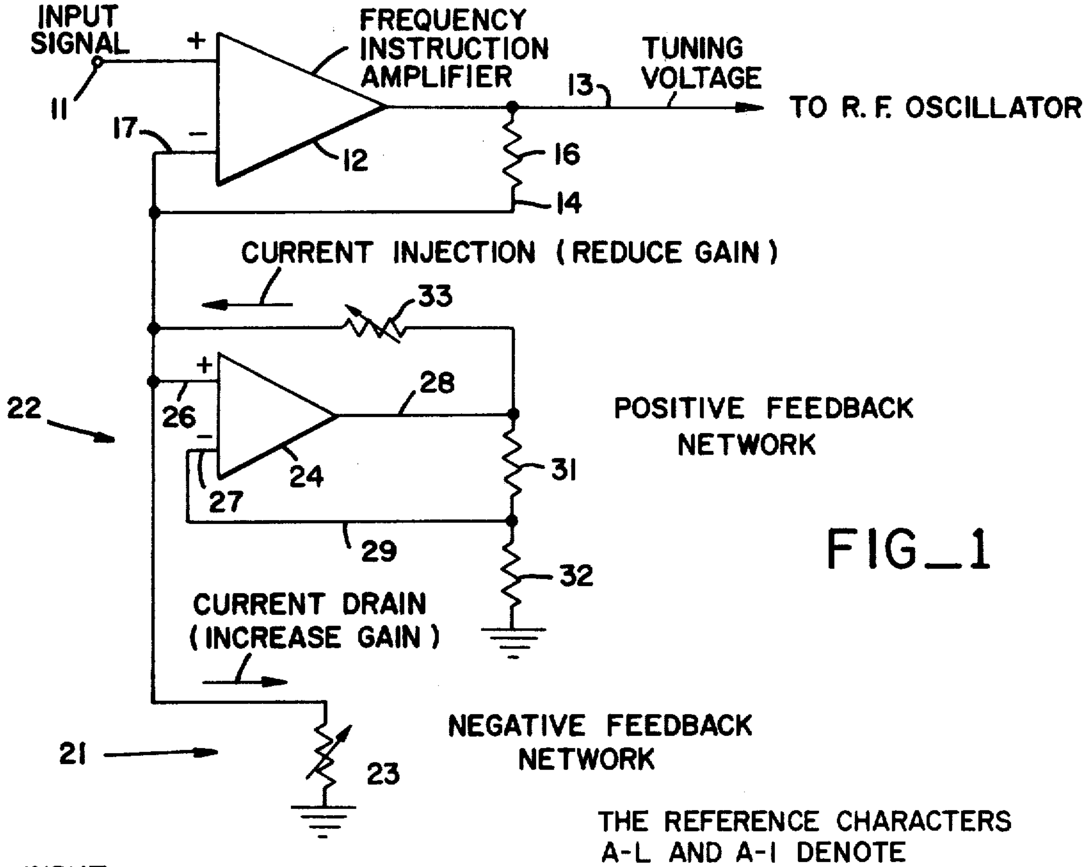
FIG. 1 is a simplified circuit schematic embodying the present invention.

FIG. 1 is a simplified schematic of the variable gain amplifier system of the present invention. An input control voltage signal at terminal 11 is coupled to the positive or noninverting terminal of an operational amplifier 12. An output line 13 of the amplifier labeled Tuning Voltage is coupled to a radio frequency (R.F.) oscillator, not shown, and more specifically, for example, to the varactor in the oscillator for tuning or sweeping the oscillator through a certain frequency range. This range is, of course, determined by the rampe type input signal on the terminal 11.

As discussed above since the tuning voltage to output frequency relation of a typical RF oscillator is not perfectly linear the frequency instruction amplifier 12 must have its gain varied throughout the tuning range to compensate for this nonlinearity.

Specifically, the gain of amplifier 12, which approaches infinity, is varied by means of a negative feedback loop 14 which includes a resistor 16 coupled between the output line 13 of the amplifier back to the inverting input 17 (designated −) of the amplifier. Amplifier 12 of the operational type where the input impedance and gain approaches infinity and where the inverting input 17 must track or equal the noninverting or + input 11. In other words, as the input signal on terminal 11 is increased, the level of inverting input 17 must increase by an equal amount. Thus, for practical purposes the inverting input 17 has a voltage signal on it which is substantially identical to the input control voltage signal on terminal 11.

Coupled to the feedback loop 14 and in shunt with this loop to increase or decrease the amount of current in the loop are first and second circuit networks 21 and 22. Network 21 is responsive to the input control voltage signal, as well as its own variable resistance, since it is coupled to the inverting input 17 which as discussed above has substantially the same voltage signal on it as terminal 11. Network 21 is in effect a voltage responsive variable resistor 23 which is in series with resistor 16 to drain current from the feedback loop 14 thereby increasing the gain of amplifier 12. The drain of current acts to increase the loop feedback factor, $\beta$, and therefore increase the gain proportionally. This is accomplished as will be discussed below in a plurality of discrete gain values each of these values corresponding to a predetermined voltage level of the input control voltage signal. Thus, the network 21 functions in a negative feedback mode.

On the other hand, the second network 22 functions as a positive feedback network injecting current into the feedback loop 14 to reduce the gain of amplifier 12. This decrease or reduction of gain is accomplished as in the case of network 21 in a plurality of discrete gain values for amplifier 12 each of the values corresponding to a predetermined voltage level of the input control voltage signal on terminal 11. Circuit network 22 includes an amplifier 24 having a noninverting input 26 coupled to inverting input 17 and an inverting input 27 coupled to an output terminal 28 of the amplifier through a negative feedback loop 29. Alternatively, noninverting input 26 may be connected to noninverting input 11 of amplifier 12 with a quantitative but not qualitative change in operation. This loop includes a series resistive divider network which includes resistor 31 and 32. The output of amplifier 28 is coupled back to inverting input 17 of amplifier 12 through a voltage responsive variable resistor 33 which is as will be described below may be varied between several discrete values to reduce the gain of amplifier 12 by injecting current into feedback loop 14. Network 22 acts as a negative resistance loading element for the feedback circuit 14.

Thus, networks 21 and 22 in effect serve as nonlinear shunts in the feedback circuit 14 of amplifier 12 either draining current from the feedback path to increase the closed loop gain or injecting current into the feedback path to reduce the closed loop gain. Networks 21 and 22 as will be discussed below are variable in steps as determined by the input control voltage level to provide a nonlinear variation of the gain of amplifier 12. Since this control of the feedback loop 14 is nonlinear the gain of amplifier 12 is also, therefore, nonlinear. Thus, the output of amplifier 12 can be adjusted to compensate for the nonlinear voltage versus frequency characteristic of the RF oscillator or for any other driven circuit where a certain predetermined type of output characteristic is desired.

Figure 2A:
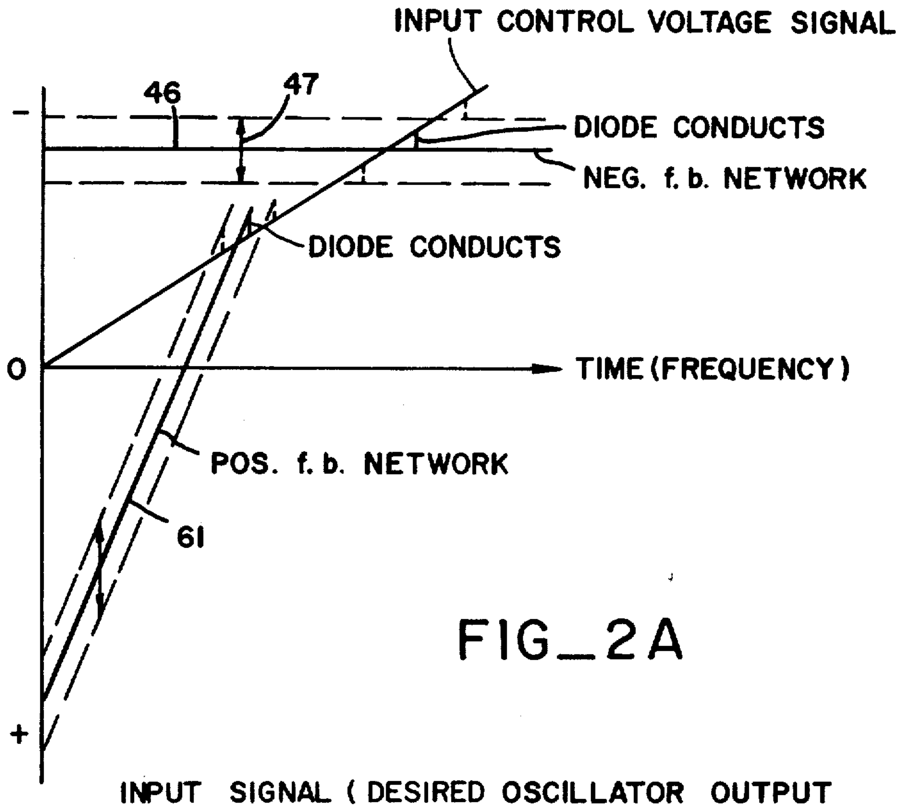
FIGS. 2A and 2B are curves useful in understanding the invention.
Figure 2B:
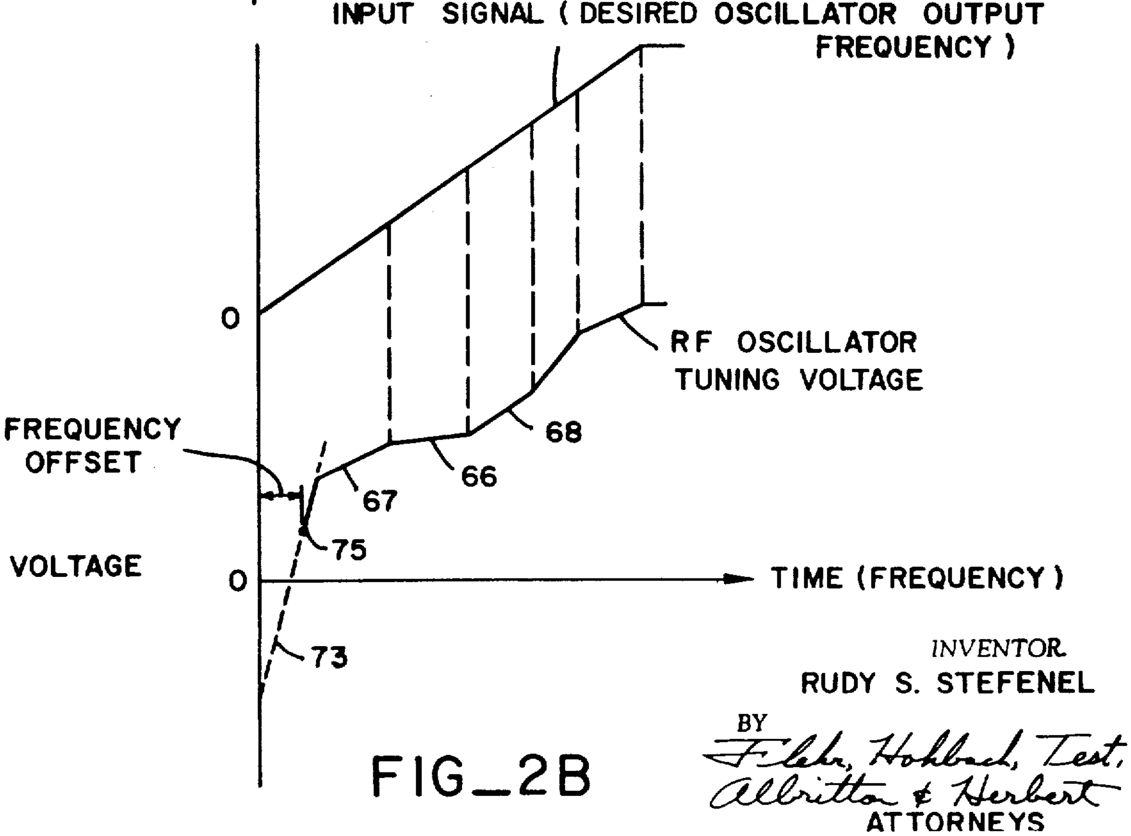

FIG. 2B illustrates the foregoing where the ramp type input signal is shown along with the resultant RF oscillator tuning voltage which appears on the output line 13 of amplifier 12. Since the tuning voltage compensates for nonlinearities in the oscillator the linear input signal characteristic is also the oscillator versus desired output frequency characteristic which is now linearized.

Figure 3:
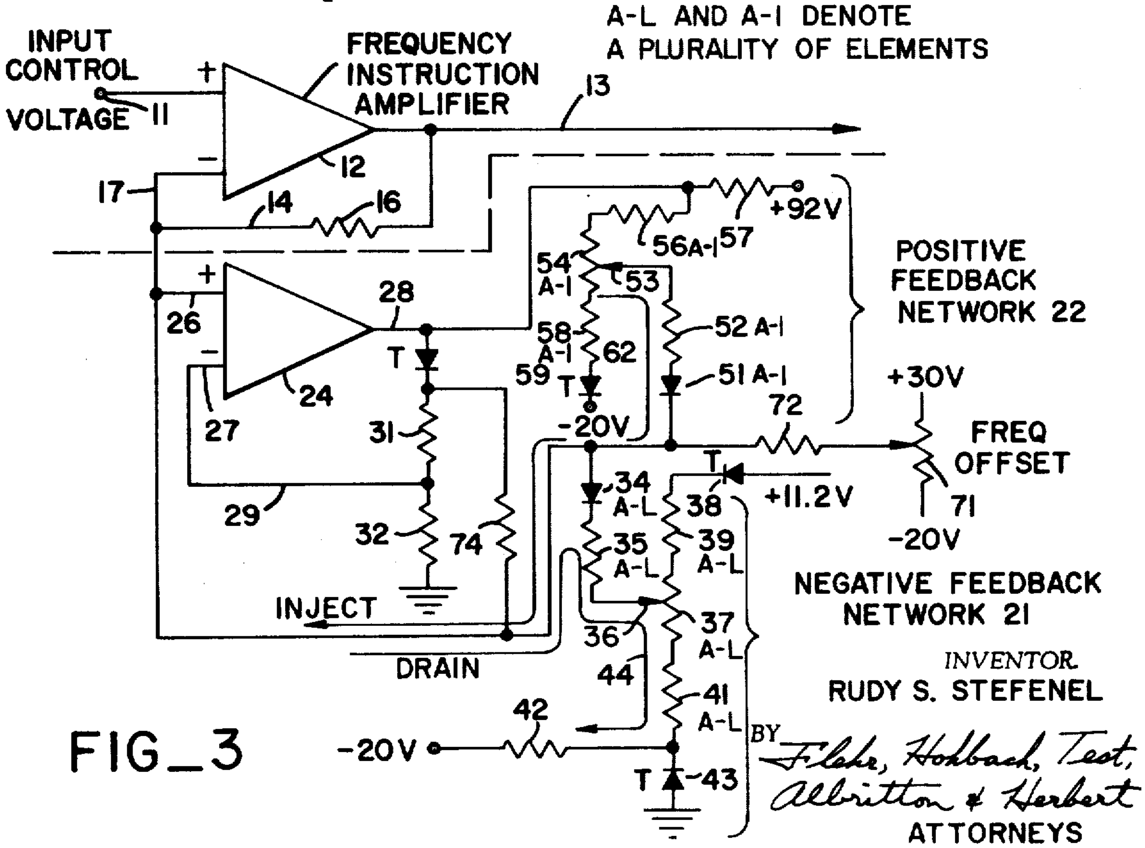
FIG. 3 is a detailed circuit schematic of FIG. 1.

FIG. 3 illustrates in detail the negative and positive feedback networks 21 and 22 of FIG. 1. Network 21 consists of twelve diode-resistor legs respectively having diodes 34A–L (only the "A" components of a single representative leg are illustrated throughout FIG. 3) which are series connected to resistors 35A–L and to the movable contacts 36 of voltage divider networks. The legs consist of potentiometers 37A–L coupled to a positive 11.2 voltage source through a series connected temperature correcting diode 38 and series connected resistors 39A–L, and series connected resistors 41A–L coupled to a negative 30 volt source through a resistor 42. In addition, a second temperature correcting diode 43 is coupled between resistor 41 and resistor 42. The specific number of legs may, of course, be varied in accordance with the desired characteristic.

Diodes 34A–L are all coupled to inverting input 17 in a manner so the current flows in a direction indicated by the arrow 44 from feedback loop 14 to drain current from the loop. Thus, the network 21 consists of twelve different legs designated A–L which by means of the adjustment of potentiometer 37 produce a different back bias on their associated diodes 34A–L to produce successively greater current drains as the input control voltage increases.

This is illustrated in FIG. 2A where the back bias level of the negative feedback network is indicated as horizontal line 46 and its variability by varying potentiometer 37 is indicated by the lines 47. When the input control voltage signal intersects with the bias line 46 and increases past the diode drop value of the diode, it will begin to conduct. Thus, variation of the potentiometer for each of the legs produces a unique input control level at which the diode in that leg will conduct.

Positive feedback network 22 is different in configuration as opposed to the negative feedback network 21 since the positive network must inject current into the feedback loop 14. To accomplish this, amplifier 24 must have a gain greater than 1, for example 3 to 4 to amplify the input control voltage signal. This appears on output line 28 and is coupled to one side of the plurality of voltage divider networks and serves to normally back bias the diodes 51A–I into a nonconductive state.

The positive feedback network 22 consists of nine different legs A–I each including the various voltage dividers having diodes 51. As with network 21, the specific number of legs may be varied. Diodes 51A–I are coupled to series connected resistors 52A–I which in turn are coupled to the moving contacts 53 of potentiometers 54A–I. One side of the potentiometer is coupled through a resistor 56A–I to output line 28 of amplifier 24. Resistor 56 is also coupled to positive 92 volt source through a resistor 57. The other side of potentiometers 54A–I is coupled to series connected resistors 58A–I and a temperature compensating diode 59 which in turn is coupled to a negative 20 volt source. Adjustment of potentiometers 54A–I provide several different levels of back-biasing so that the different diodes conduct at several different levels of the input control voltage signal to provide several different discrete gain values. The foregoing is illustrated in FIG. 2A where the back-biasing level is indicated as the variable line 61 and the diode 51 conducts where the line 61 approximately crosses the input control voltage signal characteristic an amount greater than the diode drop. This produces conduction in the diode and in that particular leg of the positive feedback network. Diode 51A–I are connected from a polarity standpoint to only allow current to be injected as shown by the reference arrow 62 into feedback loop 14 of amplifier 12.

Referring to FIG. 2B since the back biasing of the diodes both of the negative feedback network 21 and the positive feedback network 22 occur at discrete levels of the input control voltage the final output characteristic of amplifier 12 will be of a segmented type with each sement having a constant gain. Where the gain is reduced from the previous value of gain, for example, as illustrated in segment 66 with reference to segment 67, this means that the current is being injected and thus the leg of a positive feedback network has been activated. Where the gain is increased, as for example in segment 68 with respect to segment 66, the negative feedback network has been activated. Thus, it is apparent that by control of the back biasing levels of both the negative feedback and the positive feedback networks 21 and 22 almost any desired tuning voltage characteristic can be obtained. Also by varying the total number of legs in each network the characteristics can be made as exact as desired.

A frequency offset as shown on FIG. 2B is provided by the frequency offset potentiometer 71 of FIG. 3 which is coupled between positive 30 and negative 20 volt sources. The moving contact of the potentiometer is coupled through a resistor 72 to the inverting input terminal 72. Resistors 74 and 72 determine the initial gain of amplifier 12 at the beginning 75 of the ramp 73 where no diodes are conducting. It is assumed that the resistance of the frequency offset potentiometer is small and therefore it has insignificant effect on the initial gain. Resistor 74 is an initial current source and resistor 72 is an initial current drain. The relationship between these two resistors determines whether the initial slope at output 13 is steeper or shallower than the input slope at 11. The position of frequency offset potentiometer 71 determines the output voltage on line 13 at the beginning 75 of the input ramp.

Where as in the circuit shown the diodes conduct with increasing input voltage, they may be reversed to cease conduction with increasing voltage. The operation also may be used with operation extending into the negative voltage region with proper bias arrangements. A current to voltage converting state may be used to precede the amplifier system and a voltage to current converting stage may be connected to the output. All of the above variations are well know in the art.

Thus, the present invention provides an improved variable gain amplifier which by means of both positive and negative feedback networks provides an output gain characteristic where the gain may be selectively increased or decreased over the entire operating range of the system as desired. While the preferred embodiment relates to linearizing the tuning characteristic of a voltage tuned oscillator the variable gain amplifier of the present invention becomes a general purpose module for creating a prescribed nonlinear input to output electrical transducer with wide general use.

I claim:

1. A variable gain amplifier system responsive to an input control voltage signal varying with time to produce an output voltage which is a shaped function of the input voltage said system comprising: amplifier means having feedback means for varying the gain of said amplifier means, an increase or decrease in the amount of feedback signal increasing or decreasing the gain of said amplifier means; first circuit network means coupled to said feedback means and responsive to increasing magnitudes of said input control voltage signal for increasing the gain of said amplifier means in a plurality of discrete gain values, each of such values corresponding to a predetermined voltage level of said input control voltage signal; and second circuit network means coupled to said feedback means and responsive to increasing magnitude of said input control voltage signal for decreasing the gain of said amplifier means in a plurality of discrete gain values, each of such values corresponding to a predetermined voltage level of said input control voltage signal whereby said output signal is a function of said input signal which has been shaped in accordance with said discrete gain values.

2. A system as in claim 1 where said first and second network means drain and inject current from and into said feedback means for controlling said gain of said amplifier means.

3. A system as in claim 1 where said first network is shunt connected to said feedback means and drains current from said feedback means in successively greater discrete steps corresponding to said discrete gain values and where said second network is shunt connected to said feedback means and injects current into said feedback means in successively greater discrete steps corresponding to said discrete gain values.

4. A system as in claim 1 where each of said first and second networks includes a plurality of legs each of which is biased to be placed in a conductive mode at a unique level of said input control voltage signal.

5. A system as in claim 4 where each of said legs includes a diode which is normally biased to place the leg in a nonconductive state.

6. A system as in claim 5 where each of said legs of said first network includes resistor means series coupled to said diode and a voltage source coupled to said resistor means for back-biasing said diode to a unique value said diode also being responsive to said input control voltage overcoming said back-biasing to become conductive and allow current to be drained from said feedback means.

7. A system as in claim 5 where said gain of said first amplifier means approaches infinity so that said feedback signal is substantially identical to said input control voltage signal where said second network includes second amplifier means for amplifying said feedback signal, an output terminal of said second amplifier means providing an amplified feedback signal, each of said legs of said second network including resistor means series coupled to said respective diodes, said output terminal being coupled to said diodes, said amplified feedback signal normally back-biasing said diodes to unique values as determined by said resistor means said diodes also being responsive to said feedback signal overcoming said back-biasing to become conductive and allow current to be injected into said feedback means.

* * * * *